United States Patent
Chen et al.

(10) Patent No.: US 10,608,043 B2
(45) Date of Patent: *Mar. 31, 2020

(54) METHOD FOR MAKING CMOS IMAGE SENSOR INCLUDING STACKED SEMICONDUCTOR CHIPS AND READOUT CIRCUITRY INCLUDING A SUPERLATTICE

(71) Applicant: ATOMERA INCORPORATED, Los Gatos, CA (US)

(72) Inventors: Yi-Ann Chen, Campbell, CA (US); Abid Husain, San Jose, CA (US); Hideki Takeuchi, San Jose, CA (US)

(73) Assignee: ATOMERA INCORPORATION, Los Gatos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/842,993

(22) Filed: Dec. 15, 2017

(65) Prior Publication Data

US 2019/0189655 A1 Jun. 20, 2019

(51) Int. Cl.
*H01L 27/146* (2006.01)
*H01L 29/15* (2006.01)
(Continued)

(52) U.S. Cl.
CPC .... *H01L 27/1469* (2013.01); *H01L 21/02164* (2013.01); *H01L 21/02532* (2013.01);
(Continued)

(58) Field of Classification Search
CPC ..... H01L 27/14616; H01L 29/152–154; H01L 29/1054; H01L 29/78696; H01L 25/167; H01L 25/0657
See application file for complete search history.

(56) References Cited

U.S. PATENT DOCUMENTS 4,937,204 A 6/1990 Ishibashi et al.
5,216,262 A 6/1993 Thu
(Continued)

FOREIGN PATENT DOCUMENTS

EP 1644984 4/2006
GB 2347520 6/2000
(Continued)

OTHER PUBLICATIONS

U.S. Appl. No. 15/664,028, filed Jul. 31, 2017.
(Continued)

*Primary Examiner* — Daniel Luke
(74) *Attorney, Agent, or Firm* — Allen, Dyer, Doppelt + Gilchrist, P.A.

(57) ABSTRACT

A method for making a CMOS image sensor may include forming a first semiconductor chip including an array of image sensor pixels and readout circuitry electrically connected thereto, forming a second semiconductor chip comprising image processing circuitry electrically connected to the readout circuitry, and coupling the first semiconductor chip and the second semiconductor chip together in a stack. The readout circuitry may include a plurality of transistors each including spaced apart source and drain regions, a superlattice channel extending between the source and drain regions, and a gate including a gate insulating layer on the superlattice channel and a gate electrode on the gate insulating layer.

20 Claims, 11 Drawing Sheets

(51) Int. Cl.
*H01L 29/10* (2006.01)
*H01L 29/66* (2006.01)
*H01L 29/16* (2006.01)
*H01L 21/02* (2006.01)
*H01L 29/78* (2006.01)

(52) U.S. Cl.
CPC .. *H01L 27/14616* (2013.01); *H01L 27/14621* (2013.01); *H01L 27/14634* (2013.01); *H01L 27/14636* (2013.01); *H01L 27/14645* (2013.01); *H01L 27/14685* (2013.01); *H01L 27/14689* (2013.01); *H01L 29/1033* (2013.01); *H01L 29/1054* (2013.01); *H01L 29/152* (2013.01); *H01L 29/155* (2013.01); *H01L 29/16* (2013.01); *H01L 29/66568* (2013.01); *H01L 29/7833* (2013.01); *H01L 27/1464* (2013.01); *H01L 27/14627* (2013.01); *H01L 29/665* (2013.01)

(56) References Cited

U.S. PATENT DOCUMENTS

| | | | |
|---|---|---|---|
| 5,357,119 A | 10/1994 | Wang et al. | |
| 5,683,934 A | 11/1997 | Candelaria | |
| 5,796,119 A | 8/1998 | Seabaugh | |
| 6,141,361 A | 10/2000 | Mears et al. | |
| 6,376,337 B1 | 4/2002 | Wang et al. | |
| 6,472,685 B2 | 10/2002 | Takagi | |
| 6,741,624 B2 | 5/2004 | Mears et al. | |
| 6,830,964 B1 | 12/2004 | Mears et al. | |
| 6,833,294 B1 | 12/2004 | Mears et al. | |
| 6,878,576 B1 | 4/2005 | Mears et al. | |
| 6,891,188 B2 | 5/2005 | Mears et al. | |
| 6,897,472 B2 | 5/2005 | Mears et al. | |
| 6,927,413 B2 | 8/2005 | Mears et al. | |
| 6,952,018 B2 | 10/2005 | Mears et al. | |
| 6,958,486 B2 | 10/2005 | Mears et al. | |
| 6,993,222 B2 | 1/2006 | Mears et al. | |
| 7,018,900 B2 | 3/2006 | Kreps | |
| 7,033,437 B2 | 4/2006 | Mears et al. | |
| 7,034,329 B2 | 4/2006 | Mears et al. | |
| 7,045,377 B2 | 5/2006 | Mears et al. | |
| 7,045,813 B2 | 5/2006 | Mears et al. | |
| 7,071,119 B2 | 7/2006 | Mears et al. | |
| 7,105,895 B2 | 9/2006 | Wang et al. | |
| 7,109,052 B2 | 9/2006 | Mears et al. | |
| 7,123,792 B1 | 10/2006 | Mears et al. | |
| 7,148,712 B1 | 12/2006 | Prey, Jr. et al. | |
| 7,153,763 B2 | 12/2006 | Hytha et al. | |
| 7,202,494 B2 | 4/2007 | Blanchard et al. | |
| 7,227,174 B2 | 6/2007 | Mears et al. | |
| 7,229,902 B2 | 6/2007 | Mears et al. | |
| 7,265,002 B2 | 9/2007 | Mears et al. | |
| 7,279,699 B2 | 10/2007 | Mears et al. | |
| 7,279,701 B2 | 10/2007 | Kreps | |
| 7,288,457 B2 | 10/2007 | Kreps | |
| 7,303,948 B2 | 12/2007 | Mears et al. | |
| 7,432,524 B2 | 10/2008 | Mears et al. | |
| 7,435,988 B2 | 10/2008 | Mears et al. | |
| 7,436,026 B2 | 10/2008 | Kreps | |
| 7,446,002 B2 | 11/2008 | Mears et al. | |
| 7,446,334 B2 | 11/2008 | Mears et al. | |
| 7,491,587 B2 | 2/2009 | Rao | |
| 7,514,328 B2 | 4/2009 | Rao | |
| 7,517,702 B2 | 4/2009 | Halilov et al. | |
| 7,531,828 B2 | 5/2009 | Mears et al. | |
| 7,531,829 B2 | 5/2009 | Blanchard | |
| 7,531,850 B2 | 5/2009 | Blanchard | |
| 7,586,116 B2 | 9/2009 | Kreps et al. | |
| 7,586,165 B2 | 9/2009 | Blanchard | |
| 7,598,515 B2 | 10/2009 | Mears et al. | |
| 7,612,366 B2 | 11/2009 | Mears et al. | |
| 7,625,767 B2 | 12/2009 | Huang et al. | |
| 7,659,539 B2 | 2/2010 | Kreps et al. | |
| 7,700,447 B2 | 4/2010 | Dukovski et al. | |
| 7,718,996 B2 | 5/2010 | Dukovski et al. | |
| 7,781,827 B2 | 8/2010 | Rao | |
| 7,812,339 B2 | 10/2010 | Mears et al. | |
| 7,863,066 B2 | 1/2011 | Mears et al. | |
| 7,880,161 B2 | 2/2011 | Mears et al. | |
| 7,928,425 B2 | 4/2011 | Rao | |
| 8,389,974 B2 | 3/2013 | Mears et al. | |
| 9,093,363 B2* | 7/2015 | Sukegawa | H01L 25/167 |
| 9,275,996 B2 | 3/2016 | Mears et al. | |
| 9,406,753 B2 | 8/2016 | Mears et al. | |
| 9,558,939 B1 | 1/2017 | Stephenson et al. | |
| 9,609,213 B2 | 3/2017 | Wakabayashi | |
| 2003/0034529 A1 | 2/2003 | Fitzgerald et al. | |
| 2003/0057416 A1 | 3/2003 | Currie et al. | |
| 2006/0220118 A1 | 10/2006 | Stephenson et al. | |
| 2007/0012910 A1 | 1/2007 | Mears et al. | |
| 2007/0020833 A1 | 1/2007 | Mears et al. | |
| 2007/0158709 A1 | 7/2007 | Mouli | |
| 2007/0197006 A1 | 8/2007 | Dukovski et al. | |
| 2008/0012004 A1 | 1/2008 | Huang et al. | |
| 2008/0258134 A1 | 10/2008 | Mears et al. | |
| 2009/0090937 A1 | 4/2009 | Park | |
| 2010/0178722 A1 | 7/2010 | De Graff et al. | |
| 2011/0215299 A1 | 9/2011 | Rao | |
| 2014/0175592 A1* | 6/2014 | Iwabuchi | H01L 23/481 257/443 |
| 2015/0008482 A1 | 1/2015 | Sato | |
| 2015/0163403 A1* | 6/2015 | Wakabayashi | H04N 5/378 348/308 |
| 2015/0357414 A1 | 12/2015 | Mears | |
| 2016/0088253 A1 | 3/2016 | Tezuka | |
| 2016/0099317 A1 | 4/2016 | Mears et al. | |
| 2016/0149023 A1 | 5/2016 | Mears et al. | |
| 2016/0336406 A1 | 11/2016 | Mears et al. | |
| 2016/0336407 A1 | 11/2016 | Mears et al. | |
| 2016/0358773 A1 | 12/2016 | Mears et al. | |
| 2017/0040371 A1 | 2/2017 | Izuhara | |
| 2017/0294514 A1 | 10/2017 | Mears | |
| 2017/0301757 A1 | 10/2017 | Mears et al. | |
| 2017/0330609 A1 | 11/2017 | Roy | |
| 2018/0240797 A1* | 8/2018 | Yokoyama | H01L 21/3205 |

FOREIGN PATENT DOCUMENTS

| | | |
|---|---|---|
| TW | I528536 | 4/2016 |
| TW | I570901 | 2/2017 |

OTHER PUBLICATIONS

U.S. Appl. No. 15/670,231, filed Aug. 7, 2017.
U.S. Appl. No. 15/670,240, filed Aug. 7, 2017.
U.S. Appl. No. 15/670,266, filed Aug. 7, 2017.
U.S. Appl. No. 15/670,274, filed Aug. 7, 2017.
U.S. Appl. No. 15/678,616, filed Aug. 16, 2017.
U.S. Appl. No. 15/678,658, filed Aug. 16, 2017.
U.S. Appl. No. 15/842,981, filed Dec. 15, 2017.
U.S. Appl. No. 15/842,990, filed Dec. 15, 2017.
U.S. Appl. No. 15/843,017, filed Dec. 15, 2017.
U.S. Appl. No. 15/842,989, filed Dec. 15, 2017.
U.S. Appl. No. 15/843,013, filed Dec. 15, 2017.
U.S. Appl. No. 15/843,044, filed Dec. 15, 2017.
U.S. Appl. No. 15/843,077, filed Dec. 15, 2017.
U.S. Appl. No. 15/843,106, filed Dec. 15, 2017.
U.S. Appl. No. 15/843,113, filed Dec. 15, 2017.
U.S. Appl. No. 15/843,121, filed Dec. 15, 2017.
U.S. Appl. No. 15/843,136, filed Dec. 15, 2017.
Luo et al., "Chemical Design of Direct-Gap Light-Emitting Silicon" published in Physical Review Letters, vol. 89, No. 7; Aug. 12, 2002; 4 pgs.
Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.

(56) References Cited

OTHER PUBLICATIONS

Novikov et al. "Silicon-based Optoelectronics" 1999-2003, pp. 1-6.
R. Tsu Phenomena in silicon nanostructure device published online Sep. 6, 2000 by Applied Physics and Materials Science & Processing, pp. 391-402.
Raphael Tsu "Si Based Green ELD: Si-Oxygen Superlattice" wysiwyg://l/http://www3.interscience.wiley.com/cgi-bin/abstract/72512946/start: published online Jul. 21, 2000; 2 pgs. Abstract Only.
U.S. Appl. No. 15/592,464, filed May 11, 2017.
Xu et al. "Effectiveness of Quasi-confinement technology for improving P-chanel Si an Ge MOSSFET performance" Department of Electrical Engineering and Computer Science, University of California, Berkeley, 2012, pp. 2, mearstech.net; retrieved from internet Jan. 18, 2016.
Xu et al. "Extension of planar bulk n-channel MOSFET scaling with oxygen insertion technology" IEEE Transactions on Electron devices, vol. 61, No. 9; Sep. 2014. pp. 3345-3349.
Xu et al., "MOSFET performance and scalability enhancement by insertion of oxygen layers", Department of Electrical Engineering and Computer Science, University of California, Berkeley, 2012, pp. 1-4.
Anonymous "Electrical Simulation Methodology" https://kb.lumerical.com/en/cmos_overview_and_methodology.html: retrieved from internet Dec. 28, 2017, pp. 1-4.
Diragoi et al. "Aligned Fusion Wafer Bonding for CMOS-MEMS and 3D Wafer-Level Integration Applications" Romanian Journal of Information Science and Technology vol. 14, No. 4, 2011, pp. 356-364.
Roger N. Clark "The Canon 7D Mark II Digital Camera Review: Sensor Noise, Thermal Noise, Dynamic Range, and Full Well Analysis" www.clarkvision.com/reviews/evaluation-canon-7dii; retrieved from internet Dec. 28, 2017, pp. 1-20.
Anonymous "OV12890 Product Guide" http://www.ovt.com/image-sensors/8-13-megapixels; retrieved from internet Dec. 28, 2017, pp. 1-2.
Matt Humrich "Camera Phone Technology 101" http://www.tomshardware.com/reviews/camera-phone-technology-101,4287.html#p1; retrieved from Internet Dec. 28, 2017, pp. 1-12.
Turchetta et al. "Introduction to CMOS Image Sensors" http://micro.magnet.fsu.edu/primer/digitalimaging/cmosimagesensors.html; retrieved from internet Dec. 28, 2017, pp. 1-12.
Lars Rehm "Sony shows off 3-layer stacked smartphone image sensor that can shoot 1000 fps at 1080p" https://www.dpreview.com/news/5696183465/sony-shows-off-3-layer-stacked-smartphone-sensor-that-can-shoot-1000-fps-at-1080p; retrieved from internet Dec. 28, 2017, pp. 1-2.
R.I. Hornsey "Noise in image sensors" https://ece.uwaterloo.ca/~ece434/Winter2008/Noise.pdf; retrieved from internet Dec. 28, 2017 pp. 1-86.
Xu et al., "Silicon molecular beam epitaxy: symposium held Apr. 29-May 3, 1991, Anaheim, California, U.S.A.", Silicon Molecular Beam Epitaxy Symposium, Apr. 29-May 3, 1991 Anaheim, CA (in: Materials Research Society symposium proceedings), Jan. 1, 1991, pp. 1-2.
Jun. 20, 2019 Office Action from U.S. Appl. No. 15/843,017; Yi-Ann Chen.
Jul. 22, 2019 Interview Summary Action from U.S. Appl. No. 15/843,017; Yi-Ann Chen.

\* cited by examiner

METHOD FOR MAKING CMOS IMAGE SENSOR INCLUDING STACKED SEMICONDUCTOR CHIPS AND READOUT CIRCUITRY INCLUDING A SUPERLATTICE

TECHNICAL FIELD

The present disclosure generally relates to semiconductor devices and, more particularly, to CMOS structures and related circuits and methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A method for making a CMOS image sensor may include forming a first semiconductor chip including an array of image sensor pixels and readout circuitry electrically connected thereto, forming a second semiconductor chip comprising image processing circuitry electrically connected to the readout circuitry, and coupling the first semiconductor chip and the second semiconductor chip together in a stack. The readout circuitry may include a plurality of transistors each including, spaced apart source and drain regions, and a superlattice channel extending between the source and drain regions, the superlattice channel may include a plurality of stacked groups of layers, with each group of layers comprising a plurality of stacked base semiconductor monolayers defining a base semiconductor portion, and at least one non-semiconductor monolayer constrained within a crystal lattice of adjacent base semiconductor portions. Each transistor may also include a gate including a gate insulating layer on the superlattice channel and a gate electrode on the gate insulating layer.

More particularly, forming the first semiconductor chip may further include forming an electrical interconnect layer beneath the array of image sensor pixels and defining a back side illumination (BSI) configuration therewith, with the electrical interconnect layer electrically connecting the array of image sensor pixels with the readout circuitry. Moreover, forming the electrical interconnect layer may include forming a semiconductor layer and a plurality of spaced apart conductive traces within the semiconductor layer.

The method may further include positioning at least one lens overlying the array of image sensor pixels, as well as positioning at least one color filter overlying the array of image sensor pixels. By way of example, the at least one color filter may include a respective color filter for each of the pixels in the array of image sensor pixels. Furthermore, the at least one color filter may include a plurality of different color filters for filtering different respective wavelengths of light.

In accordance with one example, the method may also include forming a third semiconductor chip comprising a plurality of memory circuits, and coupling may further include coupling the third semiconductor chip with the first and second semiconductor chips in the stack. In an example embodiment, the image processing circuitry may also include a plurality of transistors each including a superlattice channel. By way of example, the at least one non-semiconductor monolayer may comprise oxygen, and the semiconductor monolayers may comprise silicon.

DETAILED DESCRIPTION

Figure 1:
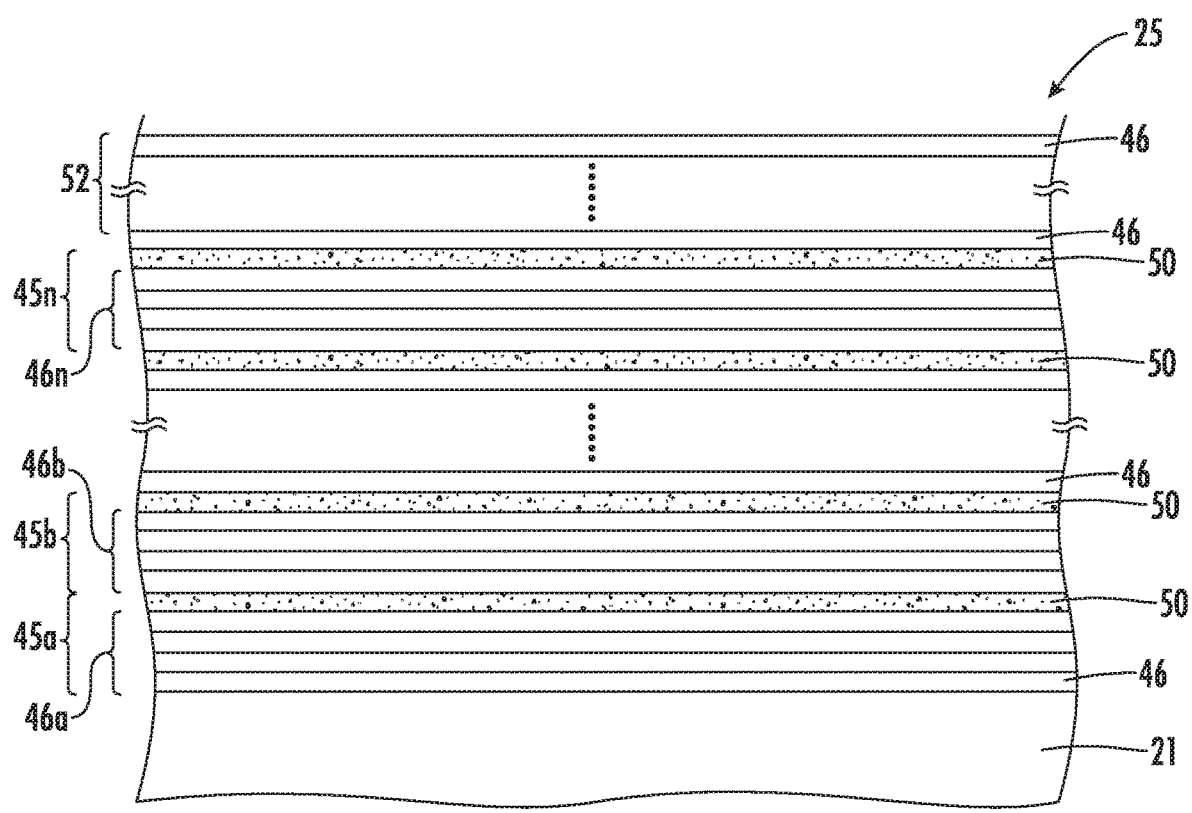
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime and multiple prime notation are used to indicate similar elements in different embodiments.

Generally speaking, the present disclosure relates to CMOS image sensor (CIS) devices having an enhanced semiconductor superlattice therein which may provide desired speed enhancement and thermal management features. The enhanced semiconductor superlattice is also referred to as an "MST" layer or "MST technology" in this disclosure and the accompanying drawings.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) =$$

$$\frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
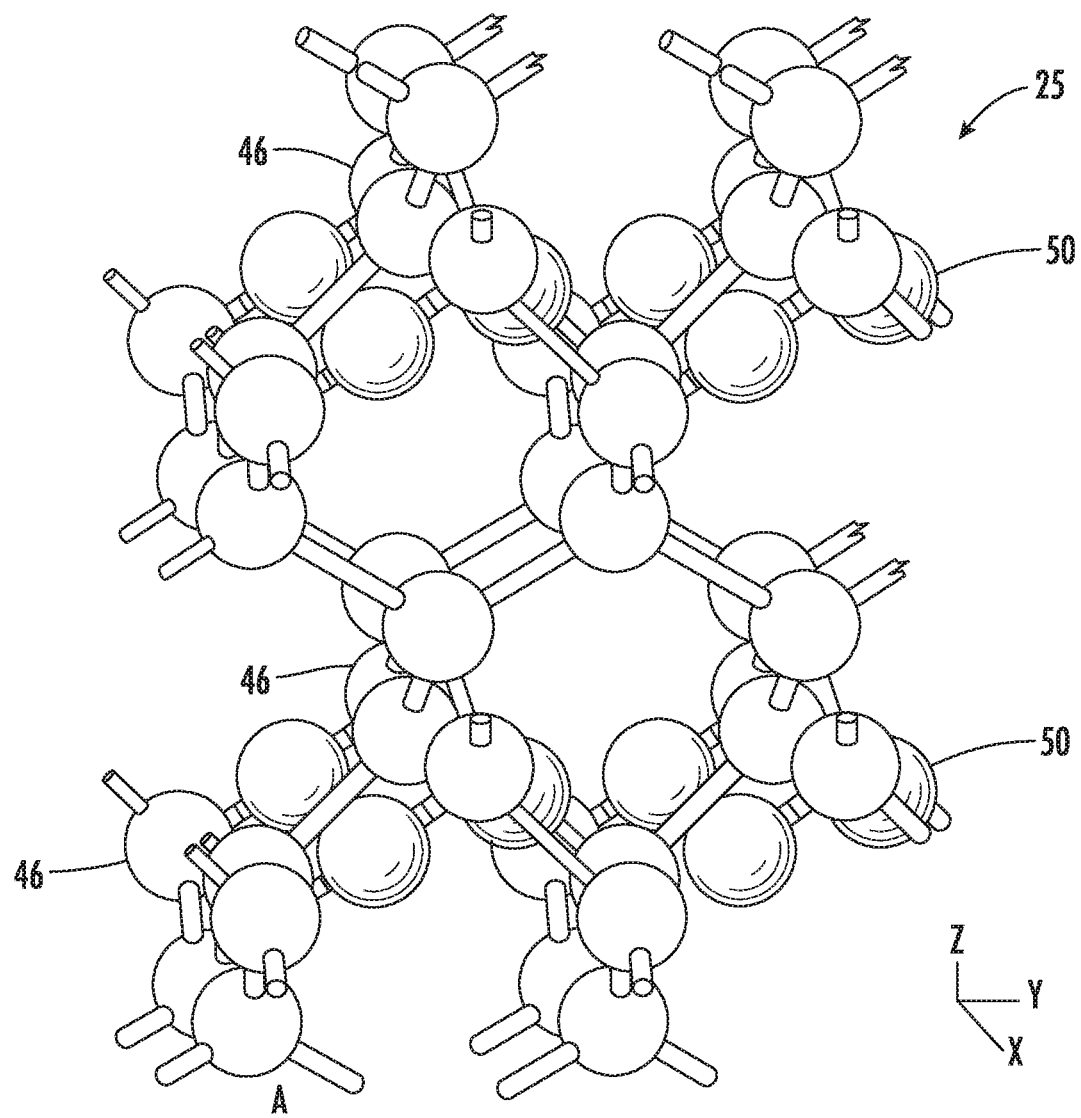
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
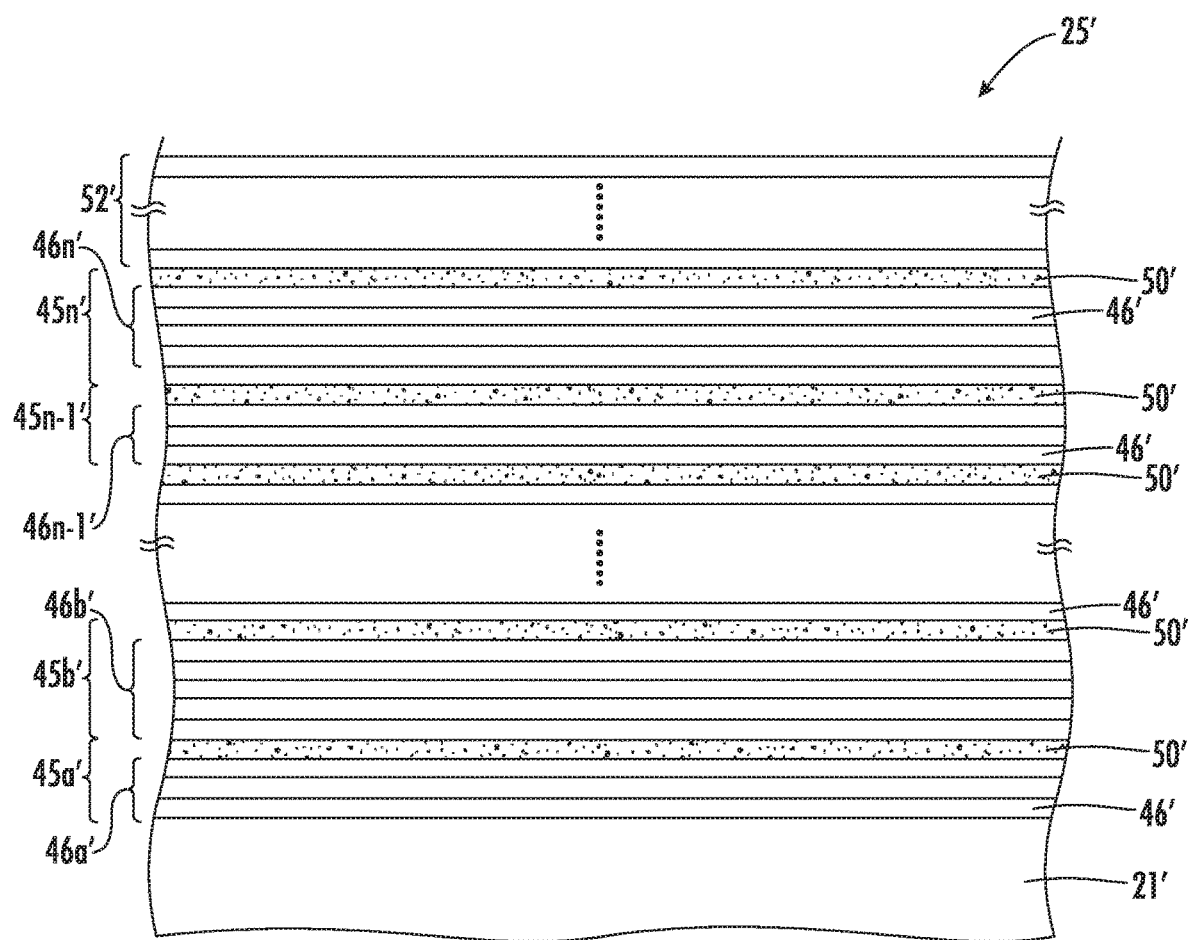
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
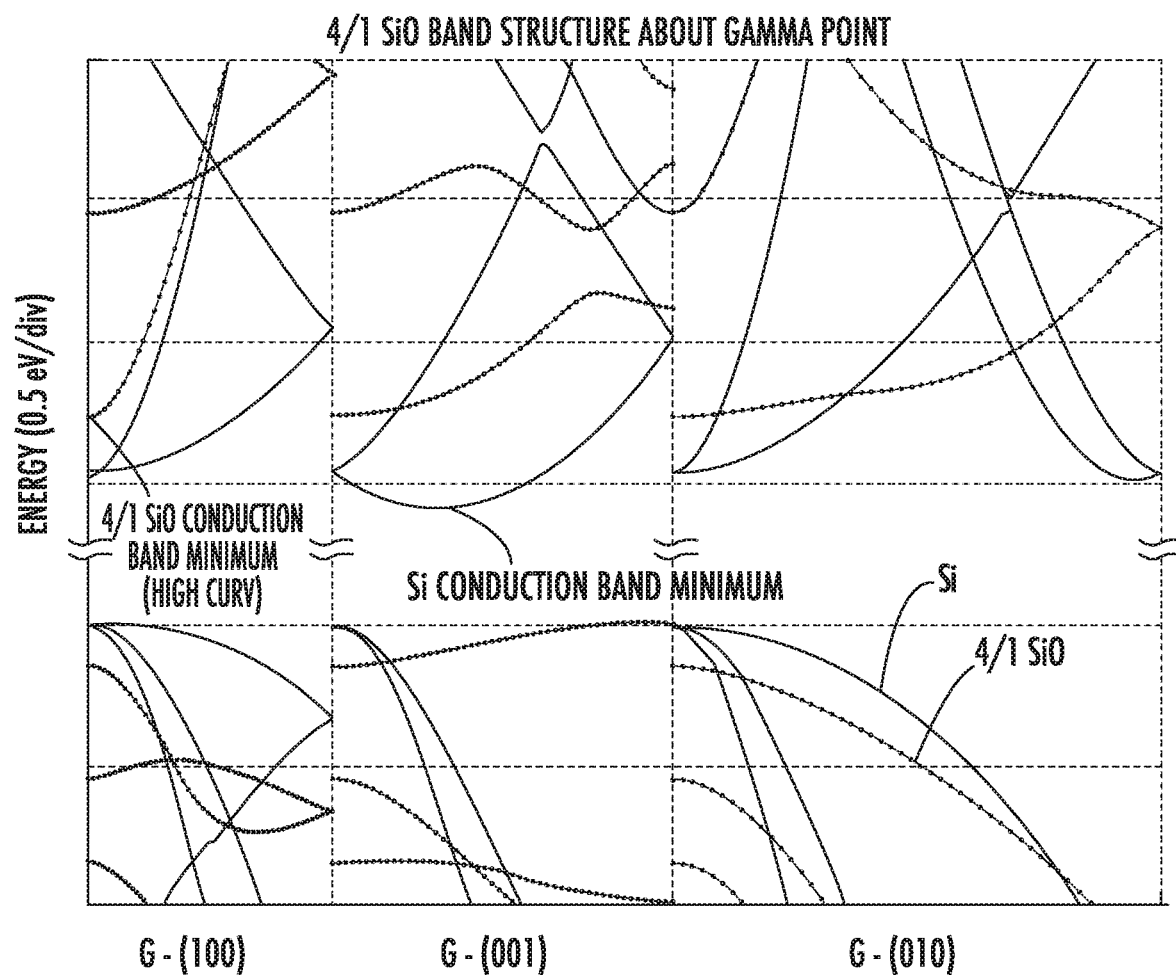
FIG. 4A is a graph of the calculated band structure from the gamma point (G) for both bulk silicon as in the prior art, and for the 4/1 Si/O superlattice as shown in FIGS. 1-2.
Figure 4B:
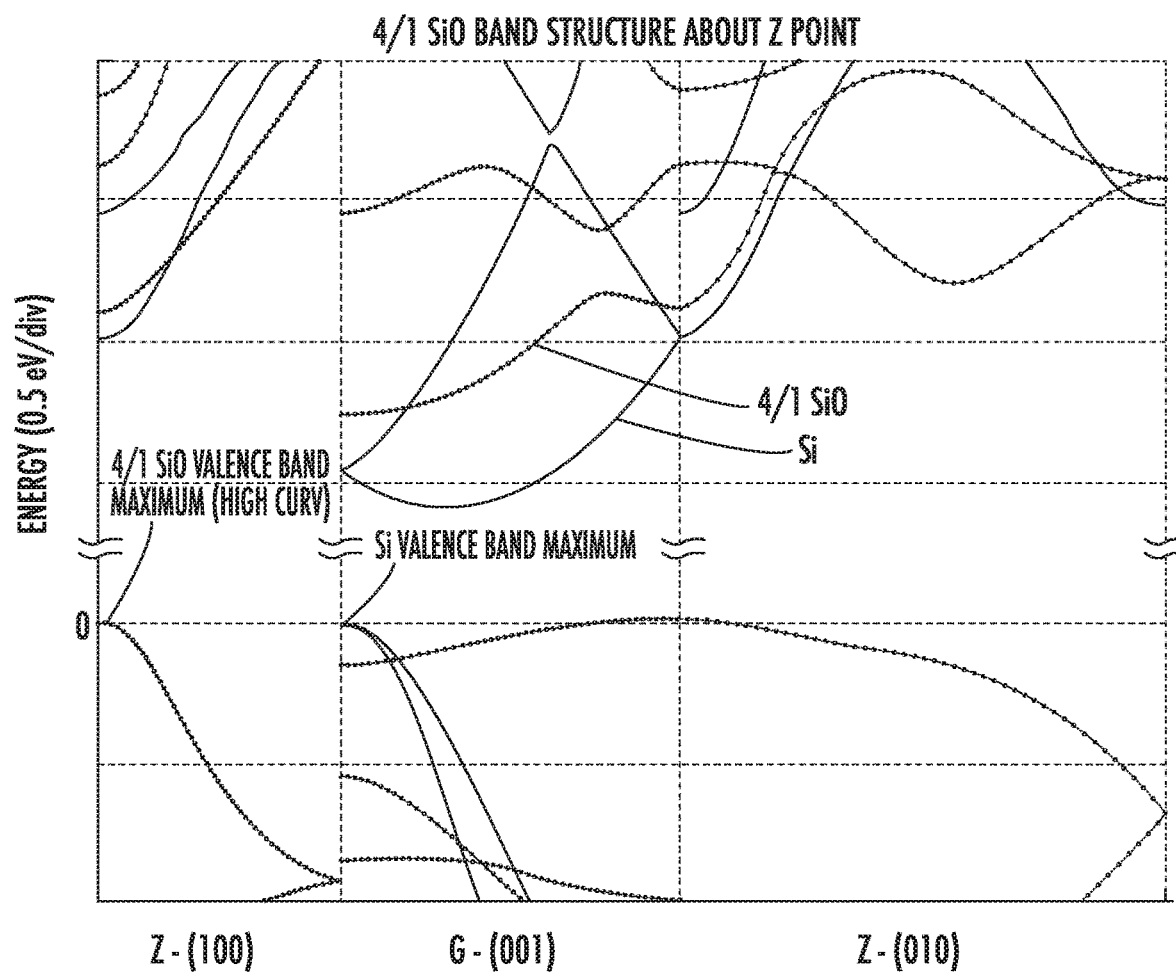
FIG. 4B is a graph of the calculated band structure from the Z point for both bulk silicon as in the prior art, and for the 4/1 Si/O superlattice as shown in FIGS. 1-2.
Figure 4C:
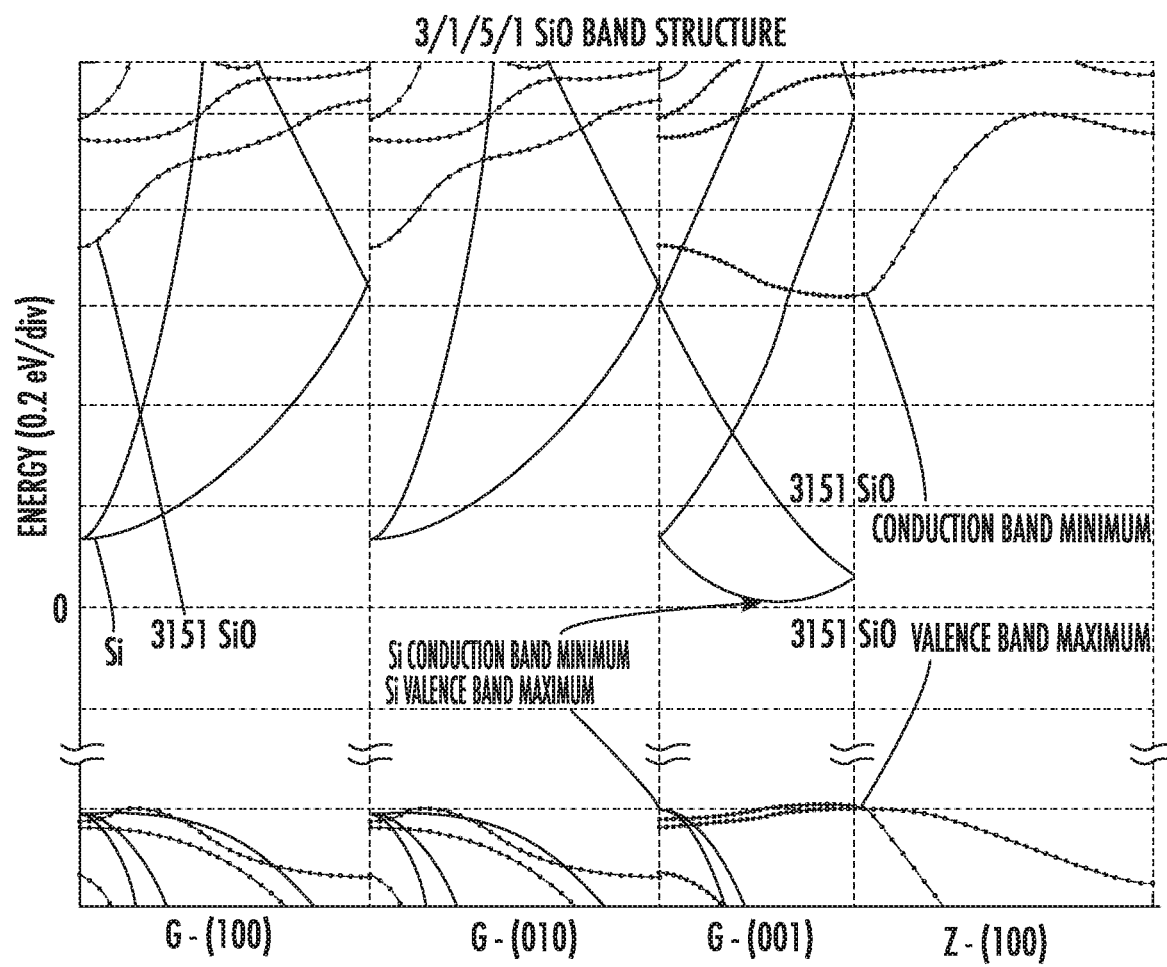
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
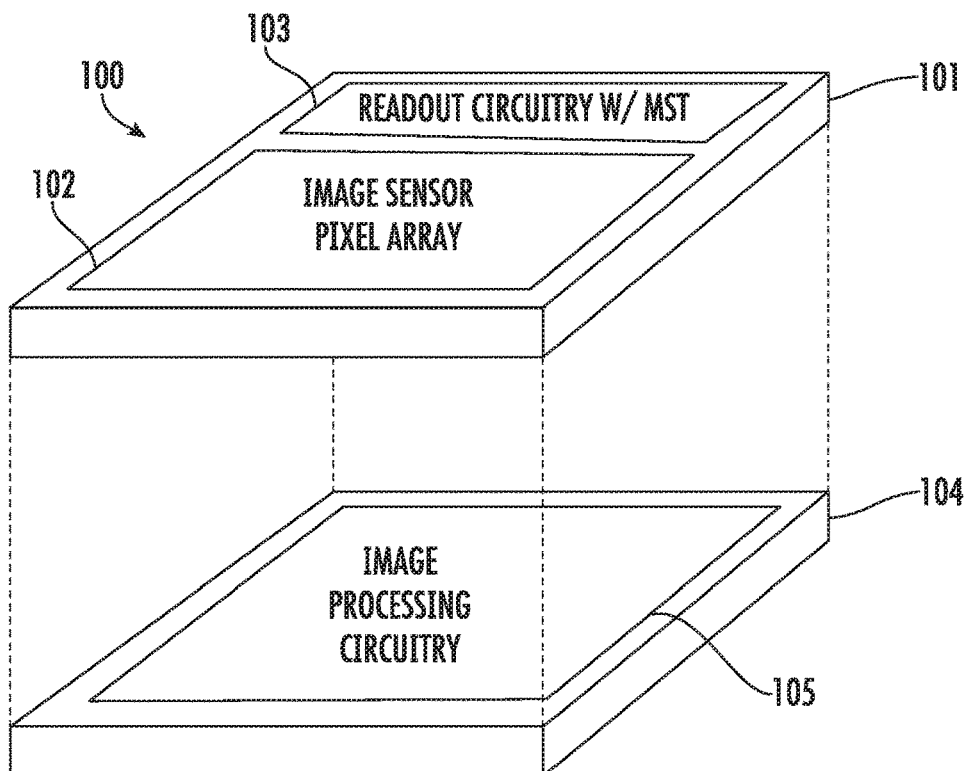
FIG. 5 is an exploded perspective view of a CMOS image sensor device in accordance with an example embodiment including stacked semiconductor chips and readout circuitry including a superlattice.

Referring now to FIG. 5, the above described superlattice structures may advantageously be used in a CMOS image sensor 100. The image sensor 100 illustratively includes a first semiconductor chip 101 which in turn includes an array of image sensor pixels 102 and readout circuitry 103 electrically connected thereto. The sensor 100 further illustratively includes a second semiconductor chip 104 coupled to the first semiconductor chip 101 in a stack and including image processing circuitry 105 electrically connected to the readout circuitry.

Figure 9:
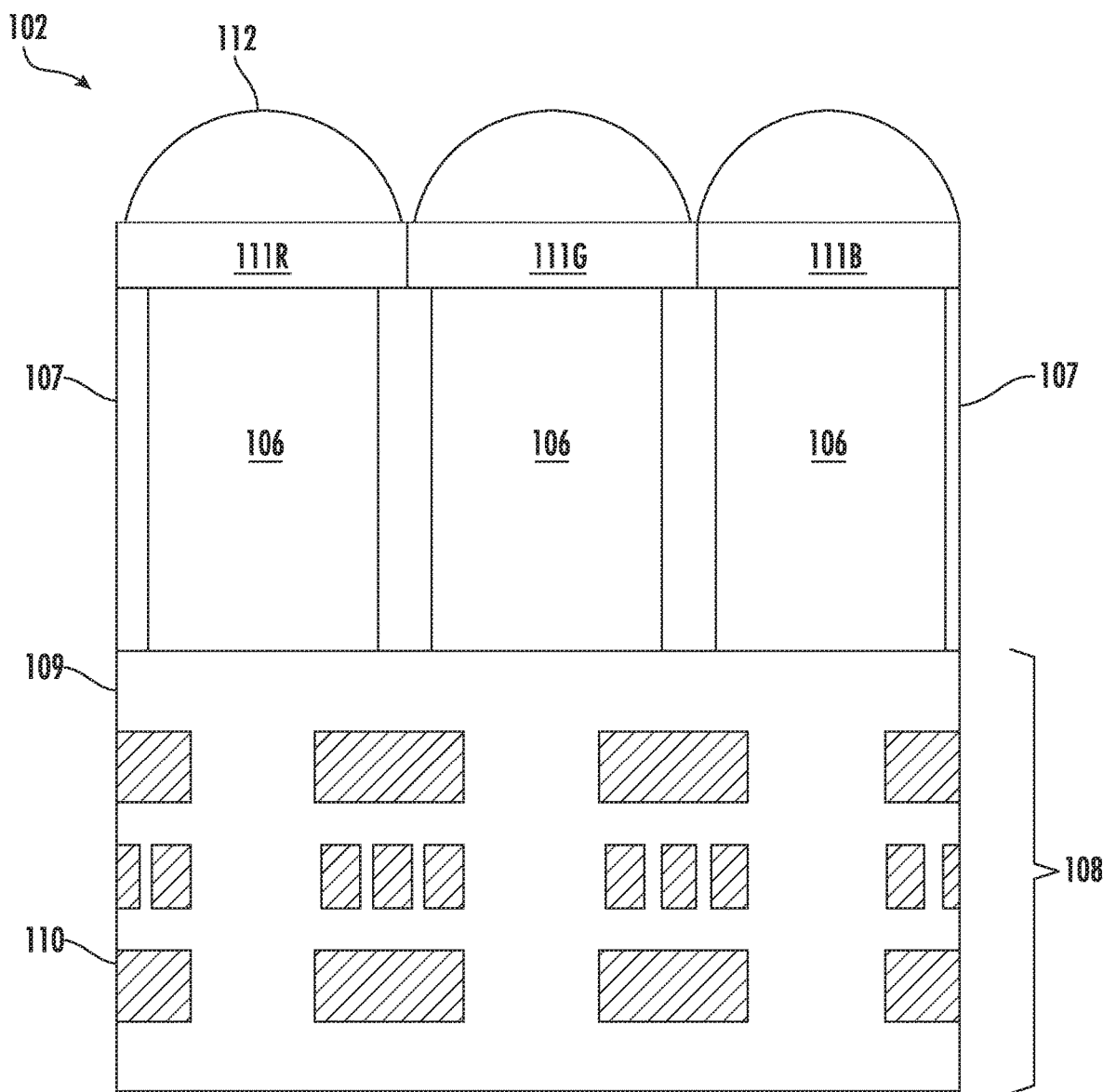
FIG. 9 is a cross-sectional diagram of an example CMOS image sensor pixel configuration which may be used in the devices of FIG. 5-7.

An example pixel cell architecture which may be used for the image sensor pixel array 102 is shown in FIG. 9. In the illustrated example, the array 102 is a back side illumination (BSI) configuration which illustratively includes a plurality of photodiodes 106 with insulating regions 107 therebetween. Furthermore, an electrical interconnect layer 108 is beneath the array of image sensor pixels 102 in the illustrated BSI configuration (although the stacked chip CIS arrangements described herein may be used with front side illumination (FSI) configurations as well). The electrical interconnect layer 108 illustratively includes a semiconductor layer 109 (e.g., polysilicon) and a plurality of spaced apart conductive traces 110 electrically connecting the array of image sensor pixels 102 with the readout circuitry 103. By way of example, the array 102 may include CMOS active pixel sensors with pinned photodiodes 106 and associated control/output circuitry (e.g., a 4T cell).

Furthermore, a respective red, green, or blue color filter 111R, 111G, or 111B may be positioned above each of the photodiodes 106, as well as a respective micro-lens 112 overlying each of the color filters. The lenses 112 may be used to advantageously gather and direct light to each of the photodiodes 106. The signal detected by each photodiode 106 may be individually read out by a row and column selector, followed by amplification circuitry (not shown) and the readout circuitry 103 to provide the signals to the image processing circuitry 105.

Generally speaking, BSI implementations may be desirable over front side illumination (FSI) configurations for a variety of reasons. First, BSI sensors typically have higher light sensitivity and higher quantum efficiency (QE) or approximately 70-80%. Moreover, in BSI sensors the electrical interconnect layer 108 is out of the optical path, which allows for a thinner substrate and results in less optical crosstalk. Furthermore, BSI configurations allow for a wider chief ray angle (CRA), which enables large aperture lenses and thinner modules.

Nevertheless, in a typical BSI CIS integration the pixel transistors and image processing circuits are fabricated on separate wafers (i.e., the first and second semiconductor chips 101, 104) using different process technologies. Generally speaking, more advanced technologies are used for fabricating the image processing circuitry 105 on the second chip 104. For example, two different technology nodes may be used, such as 40 nm for the second semiconductor wafer 105 and 65 nm or 90 nm for the first semiconductor chip 101. While this may provide for processing and cost savings with respect to the first semiconductor chip 101, use of the different nodes may cause transistor performance mismatches to occur between the readout circuitry 103 and the more advanced, high-speed image processing circuitry 105. This, in turn, may degrade product performance.

Figure 8:
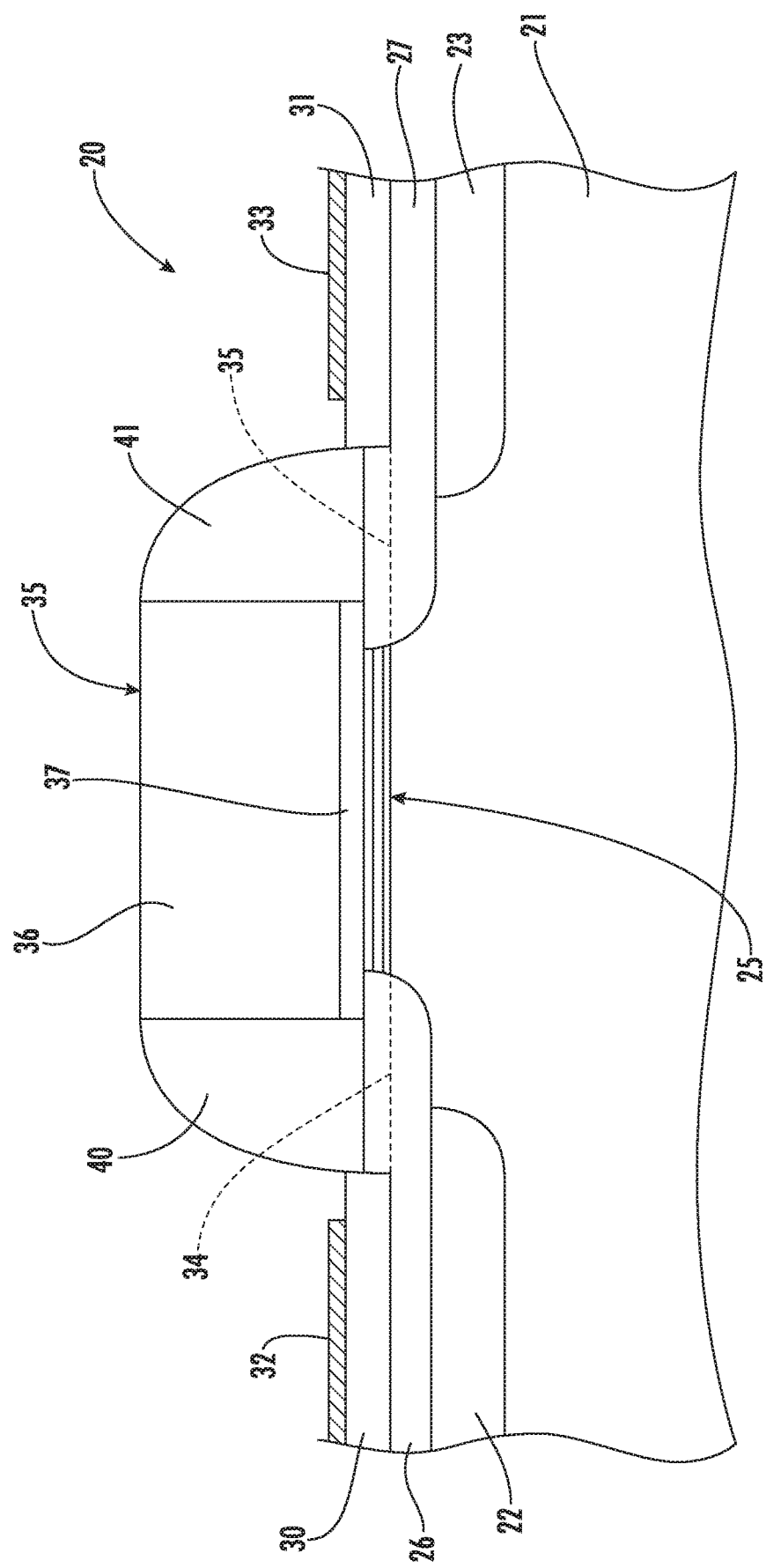
FIG. 8 is a cross-sectional diagram of a transistor including a superlattice channel which may be used in the circuits of the devices of FIGS. 5-7 in an example embodiment.

In accordance with an example implementation, the readout circuitry 103 may advantageously include a plurality of transistors (MOSFETs) 20 (FIG. 8) including the above-described band-engineered superlattice 25. More particularly, the MOSFET 20 illustratively includes a substrate 21, source/drain regions 22, 23, source/drain extensions 26, 27, and a channel region therebetween provided by the superlattice 25. Source/drain silicide layers 30, 31 and source/drain contacts 32, 33 overlie the source/drain regions, as will be appreciated by those skilled in the art. Regions indicated by dashed lines 34, 35 are optional vestigial portions formed originally with the superlattice material, but thereafter heavily doped. In other embodiments, these vestigial superlattice regions 34, 35 may not be present as will also be appreciated by those skilled in the art.

A gate 38 illustratively includes a gate insulating layer 37 adjacent the channel provided by the superlattice 25, and a gate electrode layer 36 on the gate insulating layer. Sidewall spacers 40, 41 are also provided in the illustrated MOSFET 20. It should be noted that other transistor configurations including the above-described superlattice material may also be used in different embodiments for the readout circuitry 103 in addition to the planar MOSFET 20 shown. Moreover, some portion of the channel may also be defined in the substrate 21 in certain implementations. Further details on the MOSFET 20 may be found in U.S. Pat. No. 6,897,472 to Mears et al., which is assigned to the present Applicant and hereby incorporate herein in its entirety by reference.

In particular, as described above the band-engineered MST material advantageously helps enhance charge carrier flow and thereby increase circuit speed, and thus total product performance, which helps alleviate the above-described mismatch between the readout circuitry 103 and the image processing circuitry 105. Moreover, use of the MST superlattice material also provides for a significant Vt variability improvement in the readout circuitry 103 transistors, as will be discussed further below, which may also advantageously help reduce fixed pattern noise in the image sensor 100 as well. By way of example, the superlattice channels 25 in the transistors 20 of the readout circuitry may be formed using selective epitaxy at the appropriate locations, or by blanket deposition followed by patterning of the blanket superlattice layer.

By way of reference, as an example of the speed enhancements which may be achieved using transistors with MST channels in logic circuits, simulations of various logic circuit configurations with and without MST-enabled transistors were performed. The first logic circuit was an inverter, and the simulations showed that the MST-enabled inverter had an approximate 20% decrease in leakage with a 15% increase in speed and comparable power consumption. Further, NAND logic gates with and without MST-enabled transistors were also simulated, and the MST-enabled gate had approximately 10% lower leakage with an approximate 20% increase in speed and a 5% lower power consumption. For the simulations, a 4/1 repeating MST material was used for the channel layer (as seen in FIG. 1).

In the typical BSI process flow, photodiode 106 implantation may first be performed in a silicon substrate or layer, followed by the poly/metal deposition for the electrical interconnect layer 108. Thereafter, the wafer may be flipped over and bonded to a silicon handle. Backside grinding may then be performed to reveal the photodiodes 106, and the color filters 111R, 111G, 111B and micro-lenses 112 may be provided thereafter to complete the image sensor pixel array 102.

Figure 6:
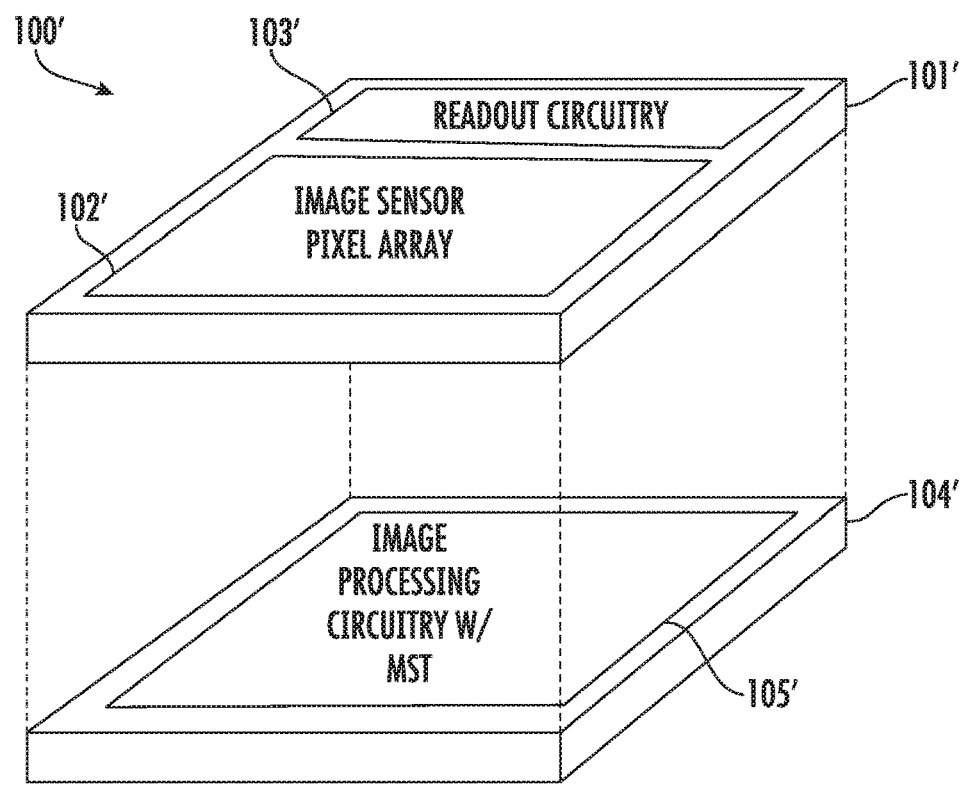
FIG. 6 is an exploded perspective view of another CMOS image sensor device in accordance with an example embodiment including stacked semiconductor chips and image processing including a superlattice.

Referring now additionally FIG. 6, another example embodiment of the image sensor 100' illustratively includes image processing circuitry 105' which has one or more sections which also include transistors (such as the transistor 20 of FIG. 8) having a superlattice channel. That is, in this example the MST material is used in the image processing circuitry 105' of the second semiconductor chip 104' rather than in the readout circuitry 103' of the first semiconductor chip 101' (although it may be used in both in some embodiments, as will be discussed further below). By way of example, the image processing circuitry 105' may include a plurality of counters, and the transistors 20 may be used to define the counters, although they may be used in other areas of the image processing circuitry as well (e.g., logic/processing circuitry, etc.).

By way of background, temporal noise due to thermal noise is an important characteristic for CIS devices. One approach for reducing thermal noise is to reduce heat dissipation using low-power circuits with low-voltage operation. More particularly, use of the MST material to provide super steep retrograde (SSR) channel formation as a result of its inherent dopant diffusion blocking effect may advantageously be leveraged to improve Vt variability and allow lower voltage operation. Further details regarding the use of the MST material to provide desired SSR profiles are provided in U.S. Pat. Pub. Nos. 2016/0336406 and 2016/0336407 to Mears et al., which are also assigned to the present Applicant and are hereby incorporated herein in their entireties by reference.

Figure 10:
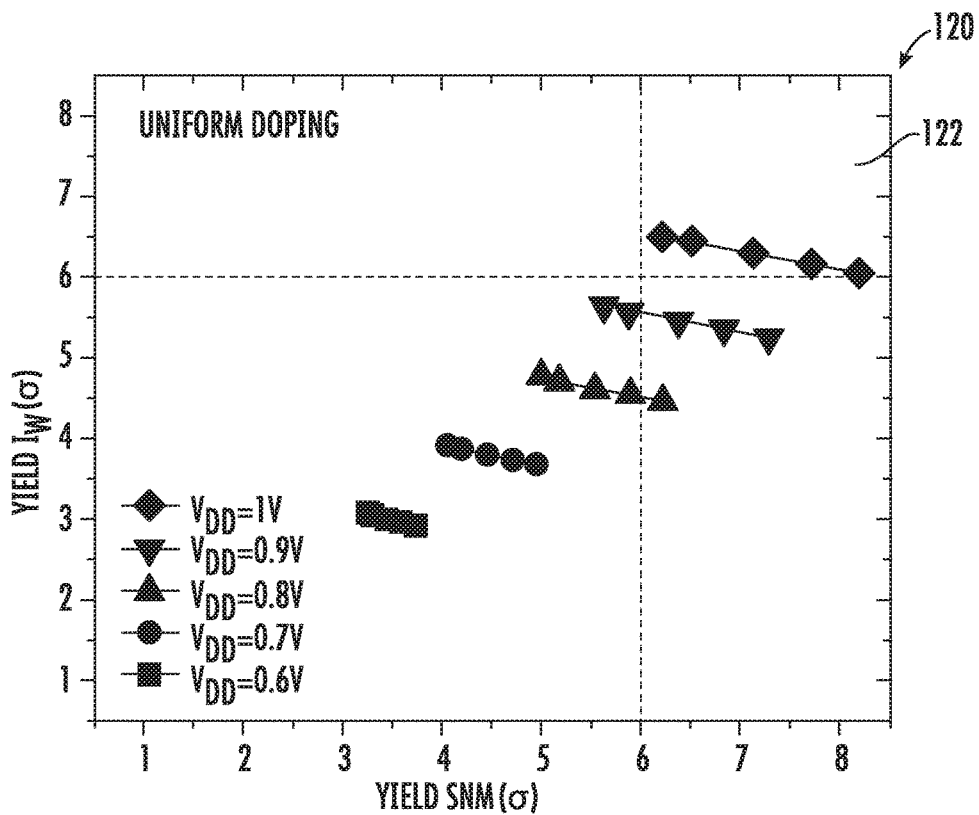
FIGS. 10 and 11 are graphs of simulated yield $I_W$ vs. yield SNM, respectively, for a prior art transistor configuration and a transistor with a superlattice channel providing a super steep retrograde profile in accordance with an example embodiment.
Figure 11:
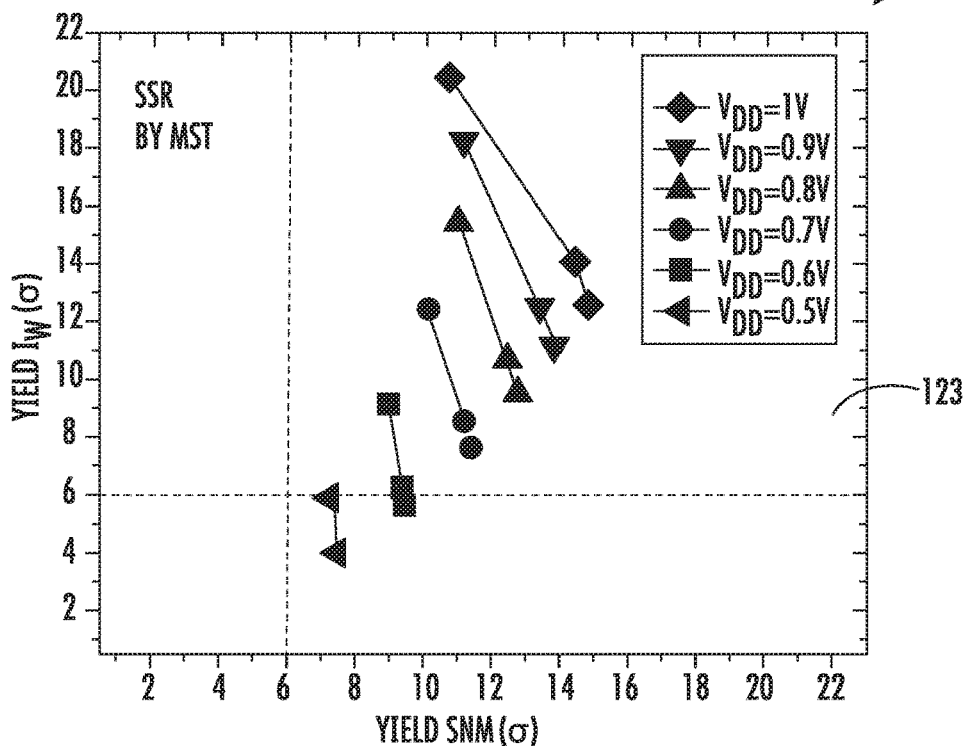

Turning now to FIGS. 10 and 11, a comparison is provided between 6T-SRAM yield for uniform doping (graph 120) and an SSR channel resulting from an MST film (graph 121) as simulated by a TCAD modelling. More particularly, the change in a functional window 122 of the graph 120 to the functional window 123 of the graph 121 demonstrates that the SSR achieved by the MST film may advantageously reduce Vdd from 1V to 0.5V, and thereby reduce heat for lower thermal noise.

Figure 7:
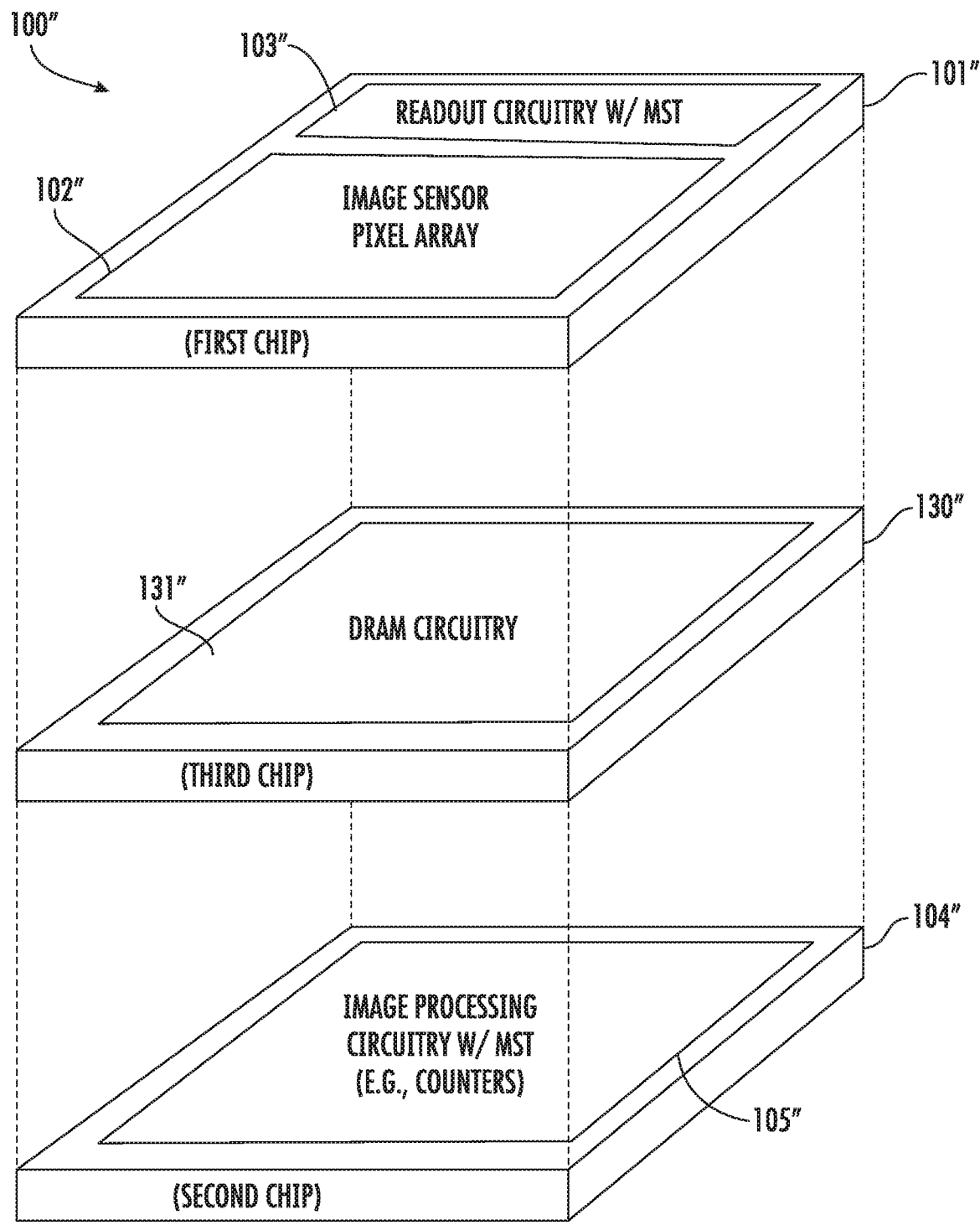
FIG. 7 is an exploded perspective view of still another CMOS image sensor device in accordance with an example embodiment including stacked semiconductor chips with a memory circuit chip and readout/image processing circuitry including a superlattice.

Referring additionally to FIG. 7, another example implementation of the CMOS image sensor 100" illustratively includes a third semiconductor chip 130" coupled with the first and second semiconductor chips 101", 104" in the stack (i.e., in between them). Here, the third chip 130" illustratively includes a plurality of memory circuits, which in the present example includes DRAM circuitry 131". Furthermore, in this example, both the readout circuitry 103" and the image processing circuitry 105" include transistors with the MST superlattice film to provide the above-noted operational advantages.

A method for making the CMOS image sensor 100 may include forming the first semiconductor chip 101 including the array of image sensor pixels 102 and readout circuitry 103 electrically connected thereto, and forming the second semiconductor chip 104 including image processing circuitry 105 electrically connected to the readout circuitry. The method may further include coupling the first semiconductor chip 101 and the second semiconductor chip 104 together in a stack as shown in FIG. 5. The readout circuitry 103 may include a plurality of transistors (such as the MOSFET 20) including a superlattice channel 25 as described further above.

A related method for making the CMOS image sensor 100' may include forming the first semiconductor chip 101' including the array of image sensor pixels 102' and readout circuitry 103' electrically connected thereto, and forming the second semiconductor chip 104' including image processing circuitry 105' electrically connected to the readout circuitry. The method may further include coupling the first semiconductor chip 101' and the second semiconductor chip 104' in a stack as shown in FIG. 6. The processing circuitry 105' may include a plurality of transistors (such as the MOSFET 20) each including a superlattice channel 25 as discussed further above.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a CMOS image sensor comprising:
    forming a first semiconductor chip comprising an array of image sensor pixels and readout circuitry electrically connected thereto;
    forming a second semiconductor chip comprising image processing circuitry to be electrically connected to the readout circuitry; and
    coupling the first semiconductor chip and the second semiconductor chip together in a stack;
    the readout circuitry comprising a plurality of transistors each comprising
        spaced apart source and drain regions,
        a superlattice channel extending between the source and drain regions, the superlattice channel comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions, and
        a gate comprising a gate insulating layer on the superlattice channel and a gate electrode on the gate insulating layer;
    wherein a superlattice is not located within the image processing circuitry.

2. The method of claim 1 wherein forming the first semiconductor chip further comprises forming an electrical interconnect layer beneath the array of image sensor pixels and defining a back side illumination (BSI) configuration therewith, the electrical interconnect layer electrically connecting the array of image sensor pixels with the readout circuitry.

3. The method of claim 2 wherein forming the electrical interconnect layer comprises forming a semiconductor layer and a plurality of spaced apart conductive traces within the semiconductor layer.

4. The method of claim 1 further comprising positioning at least one lens overlying the array of image sensor pixels.

5. The method of claim 1 further comprising positioning at least one color filter overlying the array of image sensor pixels.

6. The method of claim 5 wherein the at least one color filter comprises a respective color filter for each of the pixels in the array of image sensor pixels.

7. The method of claim 5 wherein the at least one color filter comprises a plurality of different color filters for filtering different respective wavelengths of light.

8. The method of claim 1 further comprising forming a third semiconductor chip comprising a plurality of memory circuits; and wherein coupling further comprises coupling the third semiconductor chip with the first and second semiconductor chips in the stack.

9. The method of claim 1 wherein the at least one non-semiconductor monolayer comprises oxygen.

10. The method of claim 1 wherein the semiconductor monolayers comprise silicon.

11. A method for making a CMOS image sensor comprising:
    forming a first semiconductor chip comprising an array of image sensor pixels, an electrical interconnect layer beneath the array of image sensor pixels and defining a back side illumination (BSI) configuration therewith, and readout circuitry electrically connected to the array of image sensor pixels by the electrical interconnect layer;
    forming a second semiconductor chip comprising image processing circuitry electrically to be connected to the readout circuitry;
    forming a third semiconductor chip comprising a plurality of memory circuits; and
    coupling the first, second and third semiconductor chips together in a stack;
    the readout circuitry comprising a plurality of transistors each comprising spaced apart source and drain regions, a superlattice channel extending between the source and drain regions, the superlattice channel comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions, and a gate comprising a gate insulating layer on the superlattice channel and a gate electrode on the gate insulating layer;

wherein a superlattice is not located within the image processing circuitry.

12. The method of claim 11 further comprising positioning at least one lens overlying the array of image sensor pixels.

13. The method of claim 11 further comprising positioning at least one color filter overlying the array of image sensor pixels.

14. The method of claim 11 wherein the at least one non-semiconductor monolayer comprises oxygen.

15. The method of claim 11 wherein the semiconductor monolayers comprise silicon.

16. A method for making a CMOS image sensor comprising:

forming a first semiconductor chip comprising an array of image sensor pixels and readout circuitry electrically connected thereto;

forming a second semiconductor chip comprising image processing circuitry to be electrically connected to the readout circuitry; and coupling the first semiconductor chip and the second semiconductor chip together in a stack;

the readout circuitry comprising a plurality of transistors each comprising spaced apart source and drain regions, a superlattice channel extending between the source and drain regions, the superlattice channel comprising a plurality of stacked groups of layers, each group of layers comprising a plurality of stacked base silicon monolayers defining a base silicon portion, and at least one oxygen monolayer constrained within a crystal lattice of adjacent base silicon portions, and a gate comprising a gate insulating layer on the superlattice channel and a gate electrode on the gate insulating layer;

wherein a superlattice is not located within the image processing circuitry.

17. The method of claim 16 wherein forming the first semiconductor chip further comprises forming an electrical interconnect layer beneath the array of image sensor pixels and defining a back side illumination (BSI) configuration therewith, the electrical interconnect layer electrically connecting the array of image sensor pixels with the readout circuitry.

18. The method of claim 16 further comprising positioning at least one lens overlying the array of image sensor pixels.

19. The method of claim 16 further comprising positioning at least one color filter overlying the array of image sensor pixels.

20. The method of claim 16 wherein the image processing circuitry also comprises a plurality of transistors each including a superlattice channel.

* * * * *